United States Patent [19]

Ward

[11] 4,183,095
[45] Jan. 8, 1980

[54] HIGH DENSITY MEMORY DEVICE

[75] Inventor: William P. Ward, Poway, Calif.

[73] Assignee: NCR Corporation, Dayton, Ohio

[21] Appl. No.: 939,297

[22] Filed: Sep. 1, 1978

[51] Int. Cl.² .................... G11C 13/00; G11C 11/40
[52] U.S. Cl. .................................. 365/189; 307/238;
365/174; 365/193; 365/200
[58] Field of Search .................. 307/238; 365/49, 174,
365/189, 193, 200, 202, 206

[56] References Cited
U.S. PATENT DOCUMENTS

3,969,706  7/1976  Proebsting ........................... 365/189

*Primary Examiner*—Terrell W. Fears
*Attorney, Agent, or Firm*—J. T. Cavender; Stephen F. Jewett; Edward Dugas

[57] ABSTRACT

A high density memory system is formed by reducing the number of electrical conductors that are needed to connect individual memory devices into an operable memory system. The reduction is accomplished by serially reading and writing data from and into selected memory elements on one function conductor while eliminating the need for additional control conductors by causing the state of the signal on a clock conductor as compared to the state of the signal on the function conductor at selected times to control the operating mode of the memory system.

9 Claims, 14 Drawing Figures

HIGH DENSITY MEMORY DEVICE

BACKGROUND OF THE INVENTION

This invention relates to a random access read/write memory system and, more particularly, to a high density integrated circuit memory system requiring a minimum number of signal carrying conductors so as to enable denser packaging of the memory system.

A decrease in the number of signal lines that are deposited on the surface of an integrated circuit will provide an increase in the space that can be filled with circuits. If the circuits used are memory elements, then an increase in the bit density of an integrated memory system can be increased. In turn, the cost per bit will decrease due to the more efficient utilization of both materials and space.

The advantages associated with the reduction in the number of signal lines on an integrated circuit chip have been appreciated by inventors as evidenced by the following patents: In U.S. Pat. No. 3,691,538 entitled "Serial Read-Out Memory System," by R. B. Haney there is utilized a serial-by-bit address signal to minimize the number of address lines and, in addition, to provide a serial-by-bit output signal, again in order to eliminate signal conductors.

In U.S. Pat. No. 3,786,277, entitled "Circuit Arrangement of MOS Transistors Operating According to the Dynamic Principle for Decoding the Addresses for an MOS Memory," by Basse, there is disclosed a circuit wherein a single pin connection per MOS chip is used for receiving clock pulses. The one pin connection is utilized in conjunction with control pulses, which control pulses may be clock pulses, to provide a decoding circuit.

In U.S. Pat. No. 3,975,714 entitled "Data Processing System Including an LSI Chip Containing A Memory And Its Own Address Register", by G. Weber, there is disclosed a device wherein the number of connecting contacts is minimized by dividing the address bits into groups so that the number of lines necessary to parallel receive the total number of address bits is reduced. By eliminating a number of address lines, and accordingly a number of connecting conductors on the chips, savings are made in chip space.

In U.S. Pat. No. 4,007,452, entitled "Wafer Scale Integration System," by Hoff, Jr., the wafer surface area available for electronic circuitry is increased by eliminating the scribe lines and bonding pads which are used when the wafer has to be broken along scribe lines to form individual chips. It has been appreciated that if an entire wafer were utilized for electronic circuitry that a more efficient, cheaper and generally more reliable system could be formed.

U.S. Pat. No. 4,044,339 entitled "Block Oriented Random Access Memory," by R. O. Berg, describes a memory system wherein sequential addressing of each word of a memory block is undertaken in order to achieve a reduction in the number of input pins, and a corresponding reduction in the active chip area dedicated to the signal conductors associated with the pins. In addition, the patent directs itself to saving additional chip area by replacing a buffer and word decoder with a shift register.

SUMMARY OF THE INVENTION

In a preferred embodiment of the present invention there is provided a plurality of matrix memory boards, each comprised of a matrix of integrated memory structures having four signal conductors. Means are provided for addressing selected memory structures on each of the matrix memory boards in parallel and for reading and/or writing data from or into the addressed integrated memory structures in series.

From the foregoing it can be seen that an object of the present invention is to provide an improved memory system having an increased density.

It is another object of the present invention to provide a memory system which minimizes the number of electrical interconnects between system elements.

It is a further object of the present invention to accomplish the above objects without a compromise in the speed of the memory system.

These and other objects of the present invention will become more apparent when taken in conjunction with the following description and drawings wherein like characters will indicate like parts and which drawings will form a part of the present application.

DESCRIPTION OF THE PREFERRED EMBODIMENT

Figure 1:
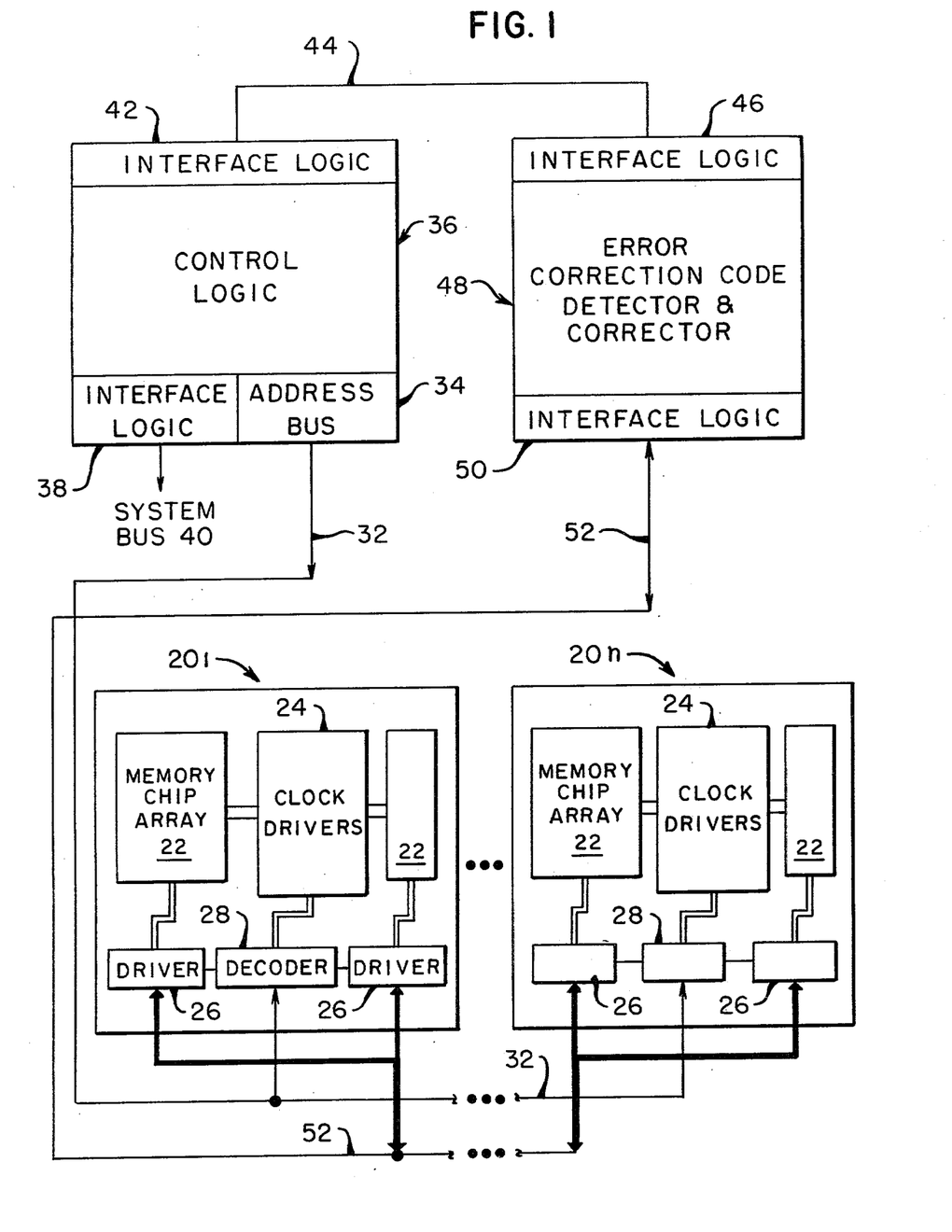
FIG. 1 is a block diagram of a memory system in accordance with the present invention.

In FIG. 1 there is displayed a plurality of memory array boards labeled $20_1$ to $20_n$. In the preferred embodiment of the invention there are 16 of these memory array boards. Each board has positioned thereon two memory chip arrays 22. Each memory chip array in the preferred embodiment is comprised of 576 memory elements, such as CCD or other such devices, with each of the memory elements having, for example, a 256K bit storage density. The storage capacity for one array board is therefore 37M-bytes. Affixed to each board is a clock driver system 24. The circuits of the clock driver system function to select memory elements on the array boards for purposes of reading and/or writing. A board select decoder 28 receives address signals from an address bus 34 along a bus line 32 and decodes the received signals to determine which of the memory array boards 20 are to respond to the messages which follow. A function driver and buffer circuit 26 is operatively associated with a corresponding memory chip array 22 for directing and receiving signals from a function input associated with the selected memory elements. A two-way bus 52 interconnects all of the function driver and buffer circuits 26 by means of interface logic 50 to a control board 48. Control board 48 contains error correction and detection circuitry of a type well-known in the prior art for correcting bit errors in the data to be read into or to be read out of the memory elements. Various types of well known ECC (Error Correcting Code) generators can be utilized as part of the control board 48. Such generators are well known in the prior art and additional description of the construction and operation of such a generator is not deemed necessary for an understanding of the present invention. Interfacing logic means 42 and 46 along with a bus line 44 connect the control board 48 to a control board 36. Control board 36 is comprised in part of a control logic section, more fully shown in FIG. 8, which control board is interfaced to a system bus 40 by means of an interfacing circuit 38.

Figure 2:
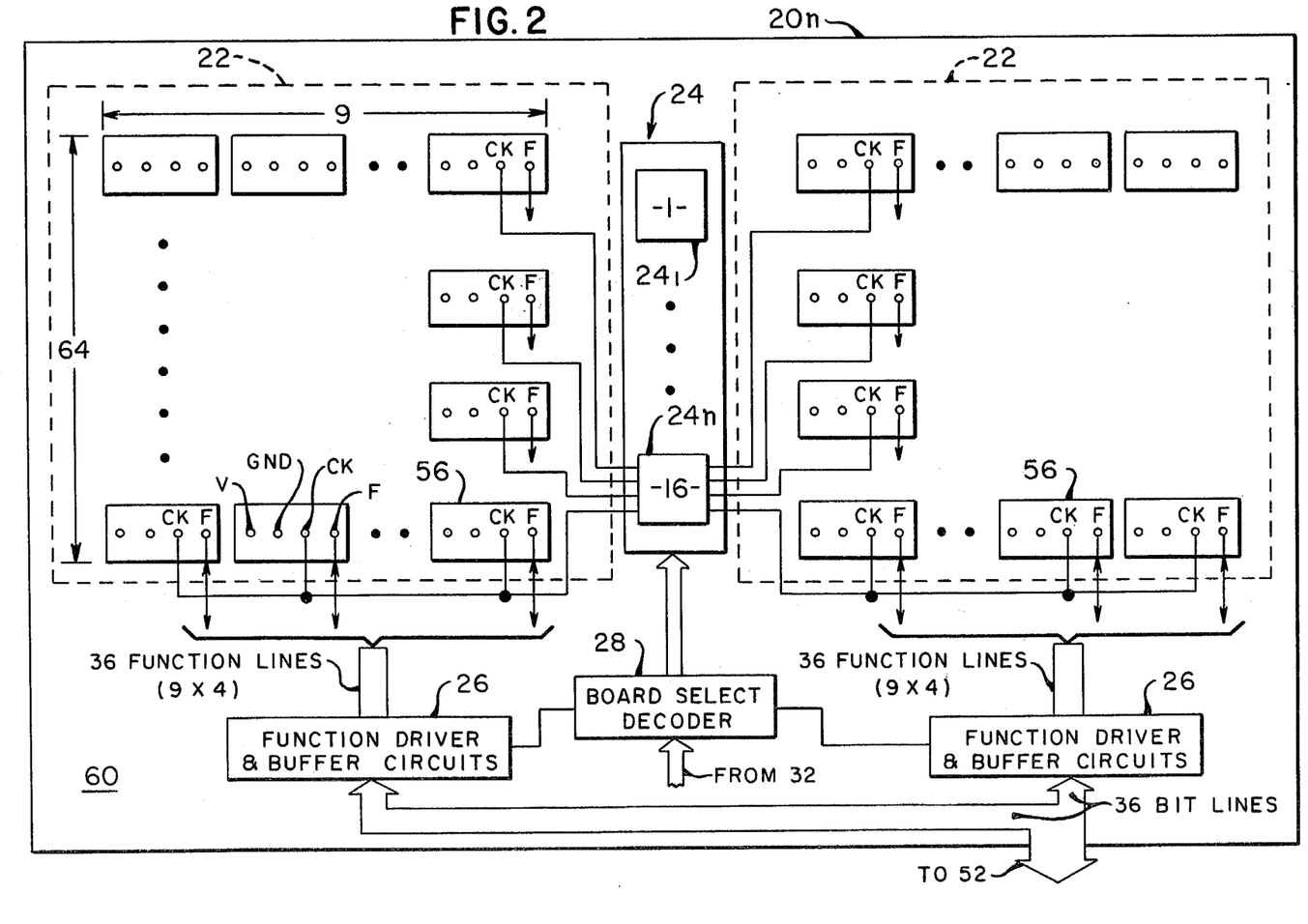
FIG. 2 is a block diagram of the electronics for an array board, which board finds particular utility in the embodiment shown in FIG. 1.

Referring to FIG. 2, a memory array board $20_n$ is formed utilizing an insulating board 60 onto which is affixed a plurality of minimum pin memory elements 56 in a two chip array configuration 22 of 9 columns by 64 rows in each array. The preferred memory element is a 4 pin device of the type disclosed in FIG. 3, and in copending application U.S. Ser. No. 812,290, filed July 1, 1977, entitled "Minimum Pin Memory Device" by W. P. Ward et al. Each of the memory elements 56 has 4 pins, a V pin for receiving power to operate the memory element, a GND pin for providing ground to the memory element, a CK pin for receiving a clock signal, and a F pin for receiving a function signal. The V pin of each of the memory elements forming the system are connected to a potential source, not shown for purposes of clarity. In a like manner, each of the GND pins is connected to a reference potential associated with the potential normally applied to the V pin. All of the CK terminals of the common row, associated memory elements 56 are connected to an associated clock driver $24_1$ through $24_n$, such that each associated clock driver provides an identical clock signal to all of the memory elements positioned in four selected rows. Such being the case, there are in the preferred embodiment 16 individual clock driver circuits, each driving 72 memory elements (36 from each memory chip array 22). The 36 individual function terminals, F, from a group of common clock connected memory elements 56 are operatively connected as individual inputs and outputs to a function driver and buffer circuits, block 26. The function terminals, F, of the remaining 15 groups of memory elements 56, each group being associated with one of the clock driver circuits, are connected in parallel with the corresponding function terminals F, that are operatively connected to the function driver and buffer circuits 26. The function driver and buffer circuits, blocks 26, each have 36 lines that are connected to the bus 52, such that 72 bits can flow to or from each of the memory array boards $20_1$ through $20_n$. A memory array board is selected by a board select decoder 28 that selects one of the 16 memory array boards $20_1$ through $20_n$ and activates one of the 16 clock drivers, $24_1$ through $24_n$, in response to an address signal that is transmitted over bus line 32 from the address bus 34.

Figure 3:
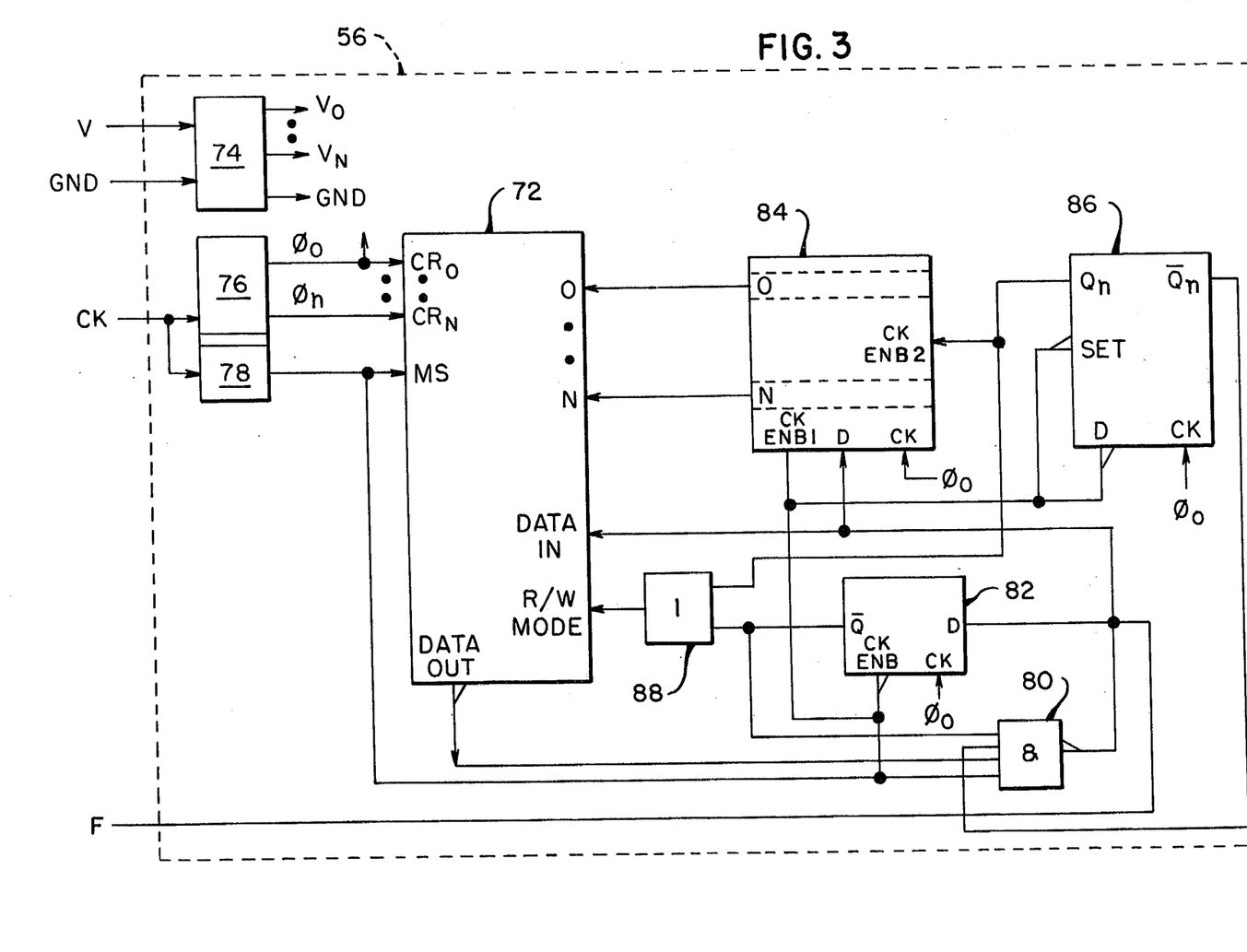
FIG. 3 is a block diagram of a minimum pin memory element which may be utilized with the array board shown in FIG. 2.

For purposes of more clearly understanding the operation of the invention, reference will now be directed to the memory element 56 which is shown in detail in FIG. 3. The pins labeled V and GND are electrically connected to the input of an internal power supply 74. The internal power supply 74 provides the voltages, for example, $V_0$ through $V_n$, that are required to operate the circuits that form the memory element 56. Power supplies which may be integrated into the structure of the memory element 56 are well-known in the integrated circuit art, and further description of the detailed construction thereof is not deemed necessary in order to insure a full and complete understanding of all aspects of the present invention. Such details of construction and operation may be found, for example, in Japanese patent application No. 146230/75, entitled "Voltage Multiplier," by G. C. Lockwood, which application is assigned to NCR Corporation, the assignee of the present application. The referenced Japanese patent application was laid open for public inspection on July 22, 1976, and bears the KOKAI (laid open) number 83443/76.

The pin CK is operatively connected to a clock generator 76, which generator converts an input synchronizing signal, for example, a clock signal, received on the CK pin into, internal clocking signals, for example, clocking signals $\phi_0$ through $\phi_n$. A decoder circuit 78, is operatively connected to the clock generator 76 for decoding a coded signal that is applied to the CK pin. The decoder circuit 78 provides a memory select signal MS, which signal changes state as a function of a code component contained in the coded signal that is applied to the CK pin. A memory device 72 which may be a charged-coupled type memory device (CCD) can be of the type described in the article "CCD Memories" by W. S. Kosonocky and D. J. Saver in *Electronic Design VI*, Mar. 15, 1976, pages V-520 to V-534. In the preferred embodiment of the invention, the memory device 72 is a 256K bit CCD device, (other bit capacity devices may be used to implement the present system). The memory device 72 receives the memory select signal on its (MS) input and responds by being either activated or inhibited, depending on the state of the MS signal, that is, whether the signal is of a "1" or a "0" level, respectively. As is common with memory devices, memory device 72 also has a plurality of address inputs labeled 0 to N, a DATA-IN terminal, a read/write (R/W MODE) selection terminal for instructing the memory to either read out data or to write in data, a DATA-OUT terminal, and one or more clocking terminals $CR_0$ to $CR_N$. A memory select signal applied to terminal (MS) enables the memory device 72 such that data may be read out of or written into memory. The absence of a memory select signal will inhibit the memory, thereby preventing data from being either read out of or written into the memory device 72. A gate means 80, which may be a NAND gate, receives as gate controls signals the memory or chip select signal $M_S$ from decoder circuit 78, plus a mode selection signal, which signal is present at the $\overline{Q}$ output of a mode selector 82 and the signal from the $\overline{Q}_n$ output of a shift register 86. The gate means 80 also receives as the gated input the signal present at the DATA OUT terminal of the memory device 72. The output of gate means 80 is connected to the function pin F and will pass signals from the DATA-OUT terminal of memory device 72 to the F pin when the gating signals to the NAND gate 80 are all at a high level, and will inhibit the passage of signals when one or more of the gating signals are of a low level. For purposes of this description, a low level is denoted as a "0" and a high level as a "1."

The mode selector 82, which in the preferred embodiment is a well-known D-type flip-flop, is connected at its D input to the function pin F and at its output $\overline{Q}$ to the R/W MODE terminal by means of an OR gate 88. The clock input, CK, of mode selector 82 is connected to receive the internal clock signal $\phi_0$. A clock enable input, $CK_{ENB.}$, is also provided for either enabling or disabling mode selector 82, regardless of the level of the clock signal $\phi_0$ appearing at the mode selector 82 terminal CK. The ½-arrow head at the $CK_{ENB.}$ input denotes that the mode selector is enabled with a low level signal and disabled with a high level signal. Such being the case, the mode selector 82 is disabled when the memory is selected, that is, when the signal MS is high.

An address shift register 84 having 0 to N storage locations or "cells" has its respective cells connected to the corresponding terminals O to N of the memory device 72. A D-input terminal to the address shift register 84 is connected to the function pin F for entering address data into the shift register. A clocking terminal CK is connected to receive the internal clocking signal $\phi_0$ for clocking the address data through the address shift register 84. The address shift register 84 is also provided with a clock enable input $CK_{ENB.1}$, which input is connected to the MS line and to the SET and D-inputs of the shift register 86. The clock signal $\phi_0$ is also applied to the CK input of shift register 86. The full count output of shift register 86, labeled $Q_n$, is directed to a clock enabling input $CK_{ENB.2}$ on the address shift register 84. In addition, the $Q_n$ output from shift register 86 is connected to the other input of the OR gate 88. The shift register 86 is selected to step through (shift) the signal on its D-input in response to the clock signal $\phi_0$. The number of stages in the shift register 86 is selected to correspond to the number of bits contained in the address signal. A SET signal will initialize shift register 86 such that all the register stages are set to a count of 1. As the signal MS on the D-input to shift register 86 is clocked through the register by the clock signal, zeros are propagated through the length of the shift register 86. When the shift register 86 is full, it outputs a "0" on its $Q_n$ output and disables the address shift register 84 through the input $CK_{ENB.2}$. In the preferred embodiment of the invention, four bits are used for address information, therefore, shift register 86 is a four-bit register.

In the preferred embodiment of the invention, memory element selection along with the read and write selection is accomplished by utilizing a change in the pulse width of the clock signal which change occurs during the application of a selected state signal to the function terminal F of the memory element. The clock signal is also used as a synchronizing signal for the electronics within and external to the memory elements. Additionally, if the memory device is, as in the preferred embodiment, a charged-coupled type device, then the clock signal is used to refresh the memory in order to preserve the data recorded therein.

Figure 4A:
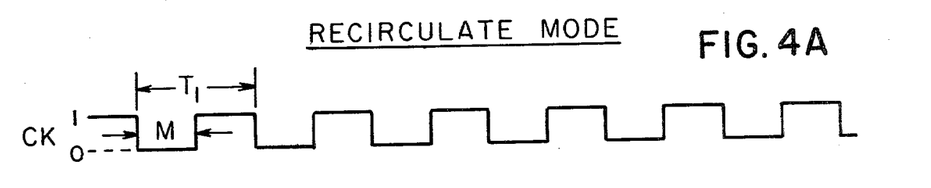
FIGS. 4A to 4F are waveforms useful in understanding the operation of the memory element of FIG. 3.
Figure 4B:
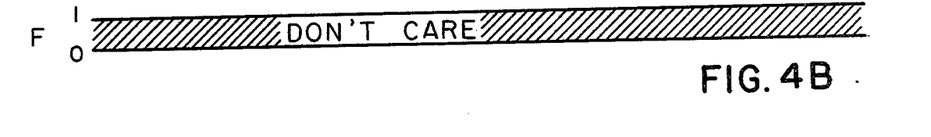
Figure 4C:
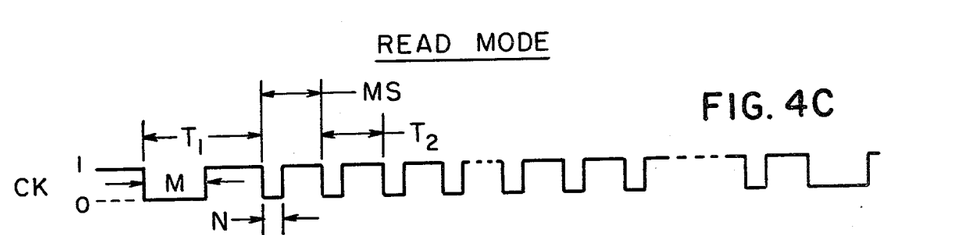
Figure 4D:
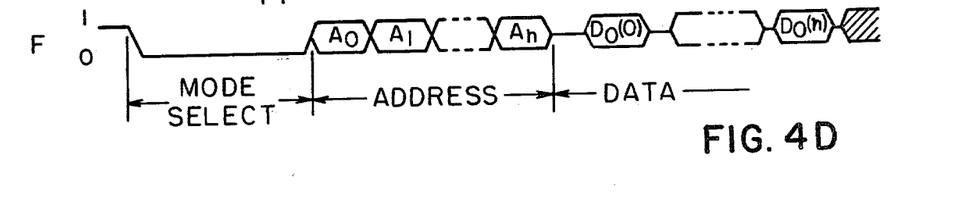

In FIG. 4A, the refresh or recirculate mode requires that the clock signal CK have a period $T_1$ with a pulse width of M. During the recirculate mode, the level of the signal on the F function terminal is immaterial, therefore, as indicated in FIG. 4B, the signal on terminal F is in a "DON'T CARE" state. When the memory device 72 is to be selected, the width of the pulse M of the clock signal CK is reduced to N as is shown in FIG. 4C. FIGS. 4C and 4D relate to the read mode of operation which mode requires that the memory element be selected and receptive to address signals. In addition to a narrowing of the pulse, the rate, or frequency, of the narrowed pulse is increased in order to speed up the operation of the memory element. The one limitation that exists with this particular coding technique as regarding the increase in rate of the clock signal CK is that the period $T_2$ must not be less than the pulse width M, otherwise erroneous memory selection will be effected. Although in the preferred embodiment of the invention there is shown a pulse width technique for coding the CK signal, it will be obvious to those persons skilled in the art that other types of coding techniques such as, for example, amplitude and/or frequency coding could also be used with equal success. In FIG. 4D, the signal present on the function pin F carries three major segments of instruction; the first segment being a MODE SELECT, the second an ADDRESS and the third DATA. Mode selection is determined by the level of the signal present on the pin F during the time period that memory selection is initiated. The mode selector 82 will be latched into the level present at its $\overline{Q}$ output by the memory select signal MS because the MS signal disables the flip-flop from further toggling in that the MS signal is applied to the $CK_{ENB.}$ input of the mode selector 82. In the read mode the $\overline{Q}$ output signal is high, and the output signal from the OR gate 88 is also high. A high level signal appearing on the R/W MODE terminal of memory device 72 selects the read mode of memory operation. A low level signal on the R/W MODE terminal selects the write mode of memory operation. The decoder circuit 78 senses the change in the pulse width of the clock signal CK and outputs the memory select signal to the (MS) terminal of the memory element 72. The signals which serially are present on the function pin F are directed to the D-input of the address shift register 84 and to the DATA IN terminal of the memory element 72. The signals on terminal F are formatted such that the n bits following the mode select portion of the signal correspond to the desired first address bits $A_0$ to $A_n$ will be loaded into the address shift register 84 at the clocking rate $\phi_0$. The address shift register 84 is enabled by receipt of the memory select signal MS at its clock enable terminal $CK_{ENB.1}$. When the address bits have been completely loaded into the address shift register 84, the shift register 86 disables the address shift register 84 by the application of a low level signal to the $CK_{ENB.2}$ input of the address shift register 84. The data corresponding to the address loaded into the memory element 72 is serially fed to the DATA OUT terminal of the memory element 72 in synchronism with subsequent $\phi_0$ pulses. The NAND gate 80 receives a high level output from the $\overline{Q}$ output of the mode selector 82, along with the high level signal from the $\overline{Q}_n$ output of the shift register 86 (when the address signal has been completely loaded into the address shift register 86), and, in addition, NAND gate 80 also receives the high level memory select signal MS. Because the memory device 72 has been selected, as previously described, the NAND gate 80 is enabled and passes the serial data $D_0(0)$ to $D_0(n)$ (FIG. 4D) from the DATA OUT terminal of memory device 72 to the function terminal F.

Figure 4E:
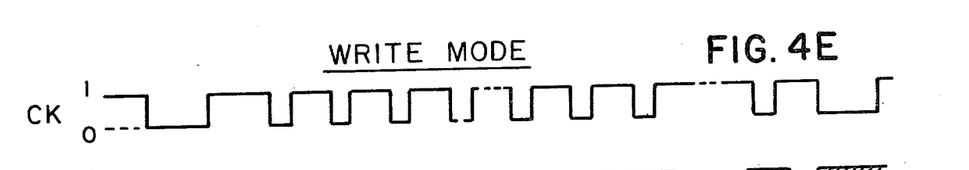
Figure 4F:
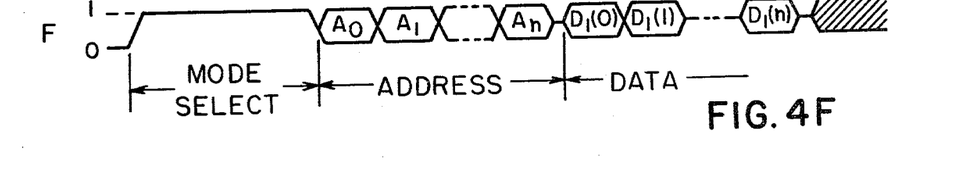

In FIGS. 4E to 4F, the WRITE MODE of operation is depicted. The mode selector 82 is toggled to output a low level signal at its $\overline{Q}$ output in response to the high level signal present at its D-input from the function pin F. The occurrence of a memory select signal MS disables the mode selector 82 thereby latching the mode selector in the WRITE MODE. When the WRITE MODE is selected, NAND gate 80 is disabled due to the low level of the signal present at the $\overline{Q}$ output of the mode selector 82. FIG. 4E shows the clock CK changing to the memory select pulse width, which causes the generation of the memory select signal MS by the decoder circuit 78. The address shift register 84 is again enabled by the presence of the memory select signal at its $CK_{ENB. 1}$ input, and the shift register 86 will be initialized by the memory select signal on its SET input. The write address is then directed to the function pin F and entered into the address shift register 84 at its D-input. Although the $\overline{Q}$ output of the mode selector is low, indicating a WRITE MODE of operation, the other input to the OR gate 88 is at a high level which causes the output of the OR gate to remain high. A high input on the R/W MODE terminal maintains the memory device in the READ MODE of operation. The memory is held in the READ MODE as the write address is loaded into the address shift register 84 in order to prevent the writing of address bits into associated memory locations as data bits. This would occur if the memory were not held in the READ MODE because the address bits also appear at the memory's DATA IN terminal at the same time as they appear on the D-input of address shift register 84. Once the address bits ae loaded, shift register 86 will output a low level signal on its $Q_n$ output, which signal will appear at the other input to OR gate 88 causing the output of OR gate 88 to go low. With the output of OR gate 88 low, the memory device will be switched into the WRITE MODE. In addition, when the $Q_n$ output goes low, the address shift register 84 is disabled. The data bits $D_1(0)$ to $D_1(n)$ are then placed on the function pin and written into memory at the address specified by the outputs 0 to N of address shift register 84. After the data is written into memory, a change in clock width back to M will cause the memory select signal to deselect the memory device.

Figure 5:
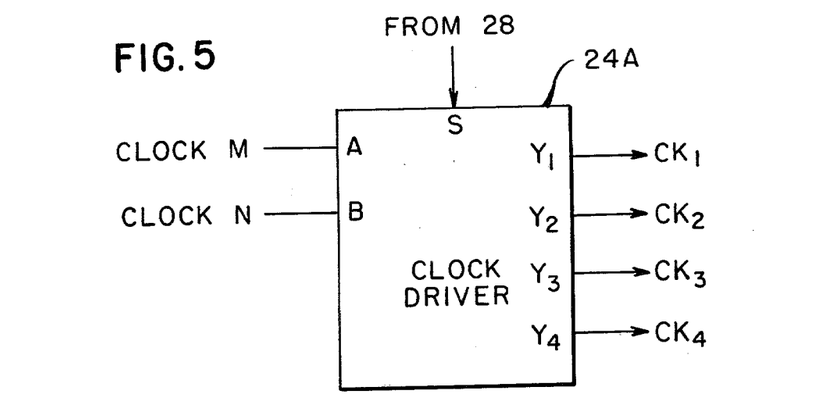
FIG. 5 illustrates a clock driver which may be utilized on the array board of FIG. 2.

Referring now to FIG. 5 wherein a typical clock driver 24A is disclosed, the driver may be a 2 to 1 multiplexer having input terminals A and B for receiving the standard clock signal, having a pulse width equal to M, and a narrow clock signal, having a pulse width equal to N. In a standard chip package there is generally housed four identical circuit elements, therefore four outputs are shown in order to depict the best mode of implementing the invention. Each of the Y outputs is directed to the CK inputs of eighteen memory elements which memory elements are all located in one row of the memory array board; 9 in each of the memory chip arrays 22 of a memory array board. An input from the board select decoder 28 is applied to the multiplexer selector input S. In operation, when a board is selected, the narrow clock (N) is applied to the CK input pin of all of the memory elements in a selected group (72 memory elements).

Figure 6:
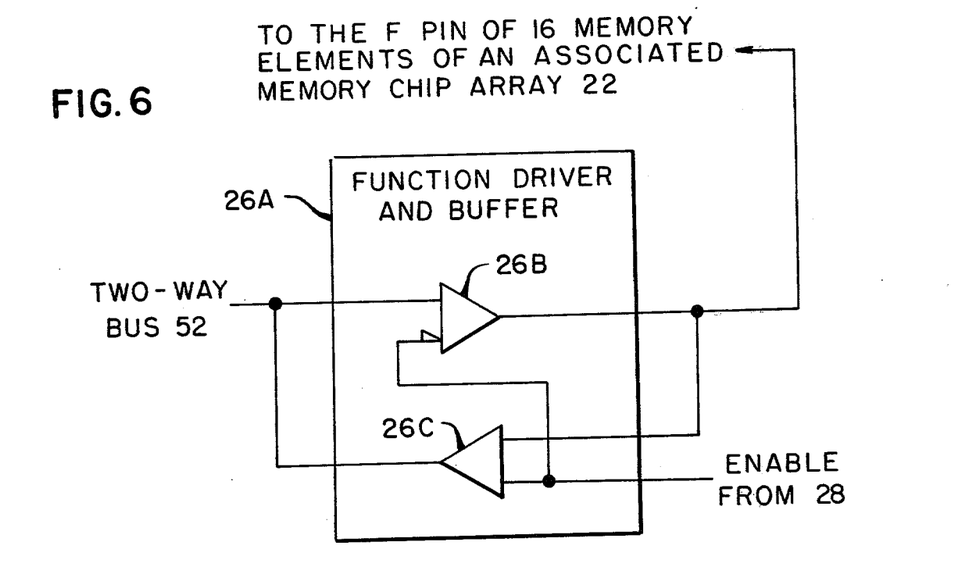
FIG. 6 illustrates a function driver and buffer which may be utilized on the array board of FIG. 2.

In FIG. 6 there is shown a typical function driver and buffer circuit 26A which is formed utilizing two amplifiers 26B and 26C connected in parallel. In the preferred embodiment of this invention there are 72 such circuits, one for each bit. Amplifier 26C has an enabled input which is operatively connected to the board select decoder 28. The output of amplifier 26B along with the input to amplifier 26C is connected to the corresponding function pin, F, of sixteen of the memory elements 56 (one function pin from each of the 16 groups of 9×4 memory elements). The input to amplifier 26B and the output of amplifier 26C are connected to the interface logic 50 by means of the two-way bus 52. In operation, signals present on the input of amplifier 26B are transmitted directly to the output, when an enable signal is not present and signals present at the input of amplifier 26C are directed to the bus 52 upon receipt of an enabling signal from the board select decoder 28.

Figure 7:
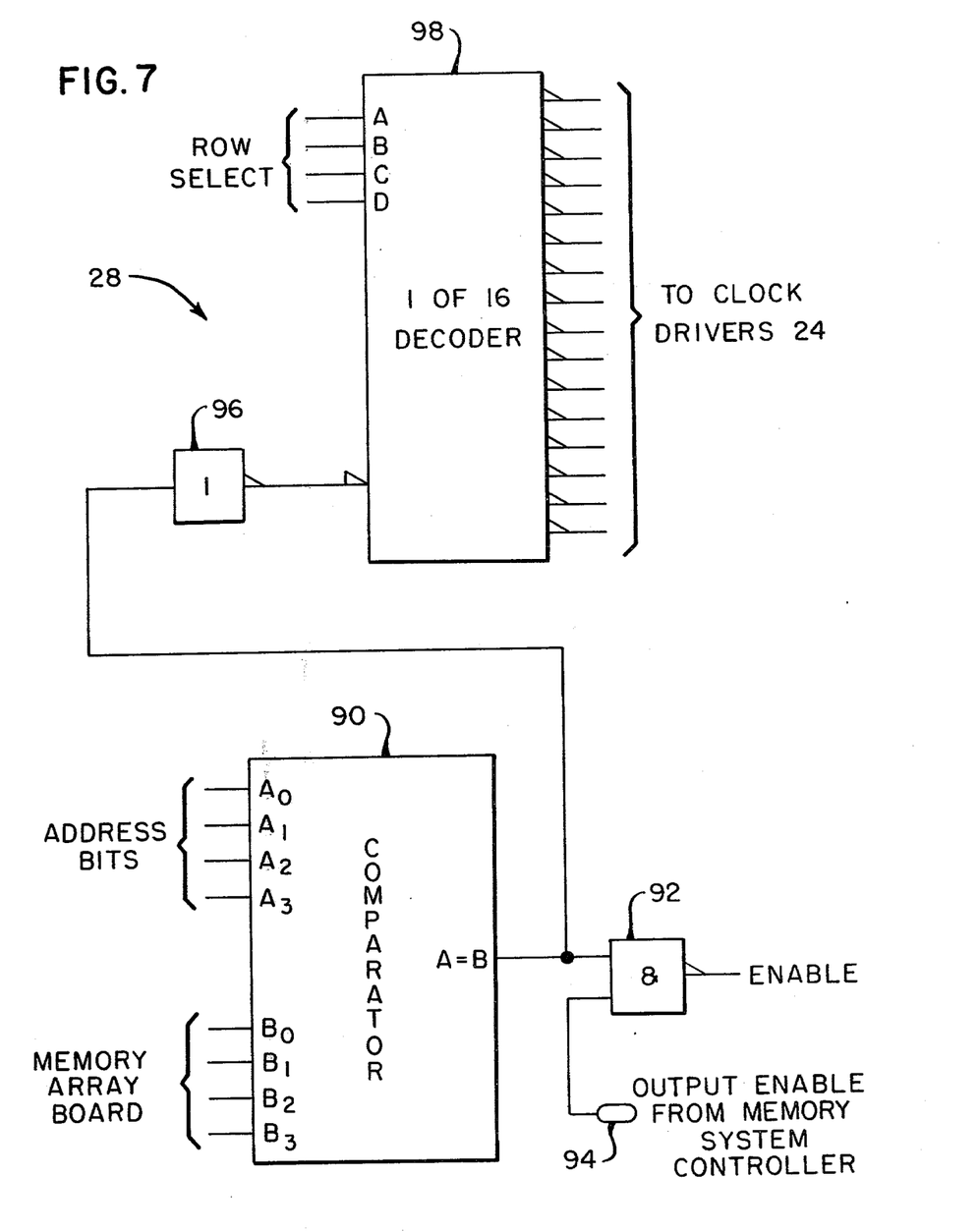
FIG. 7 illustrates in block diagram form a board select decoder circuit which may be utilized on the array board of FIG. 2.

Referring now to FIG. 7 wherein is illustrated the board select decoder 28, comprised in part of a comparator circuit 90 having a group of inputs labeled B0 to B3, which inputs are set to identify the address of the memory array board to which the comparator circuit 90 is associated. Additionally, the comparator circuit 90 is associated. Additionally, the comparator circuit 90 has inputs labeled A0 to A3 which inputs are connected to the address bus 32 for receiving address bits. When the address bits on the lines $A_0$ to $A_3$ are equal to the address bits on lines $B_0$ to $B_3$, a comparison is made and the comparator circuit 90 indicates that the particular array board is to be selected. This occurs by indexing a signal to the output of the circuit 90, which signal is directed to gate 96 and to an enable gate 92. The output of gate 96 is directed to a one of sixteen decoder 98 which decoder receives row select bit information on its input terminals labeled A to D. The decoder decodes the logic information on its input to select one of sixteen output lines that are connected to respective clock drivers 24 so as the enable one of the clock drivers. The enable gate 92 has a second input connected to an output enable terminal 94, with the output of the enable gate 92 being connected to the enable input of the function driver amplifier 26C.

Figure 8:
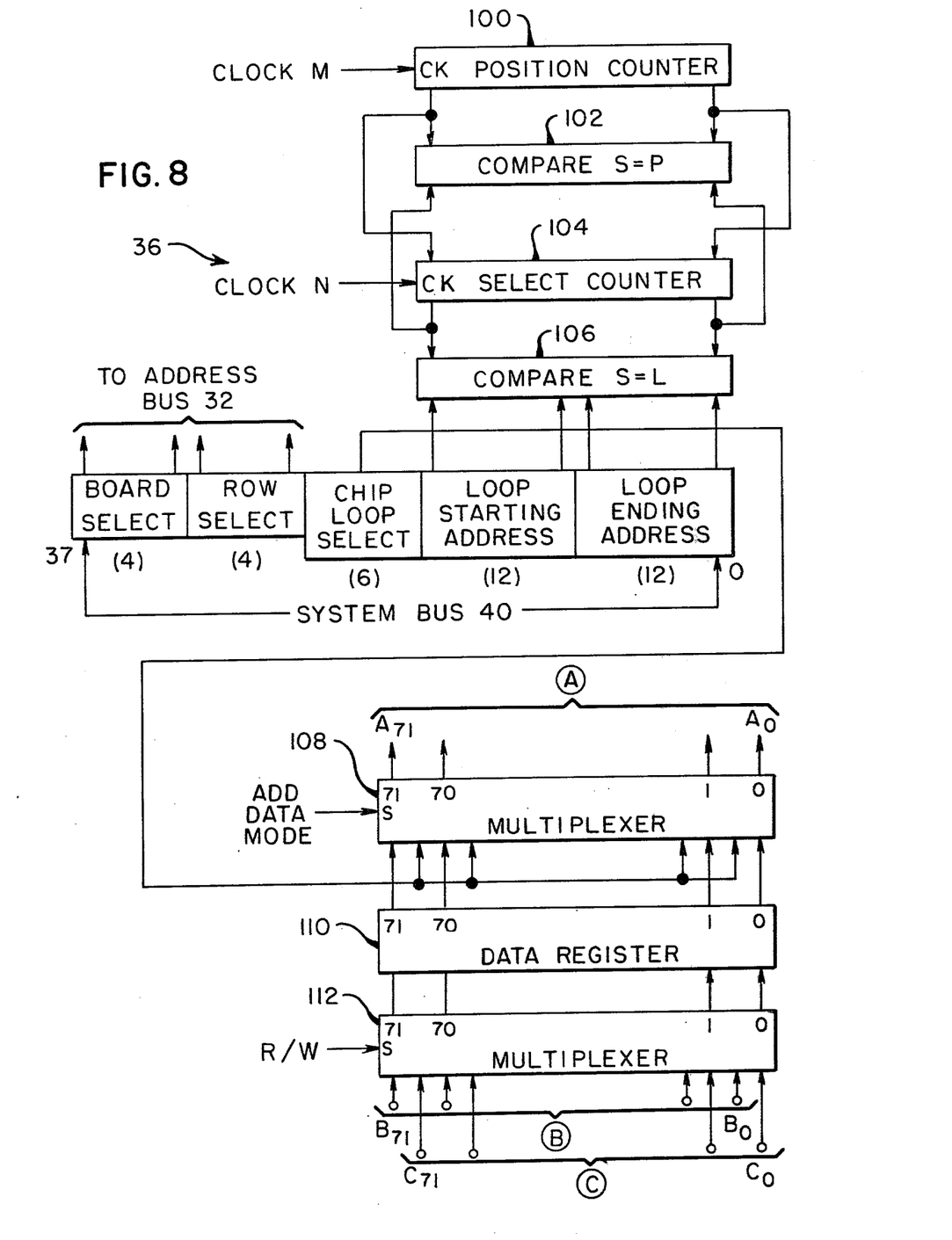
FIG. 8 is a block diagram illustrating a portion of the control logic section of the system illustrated in FIG. 1.
Figure 9:
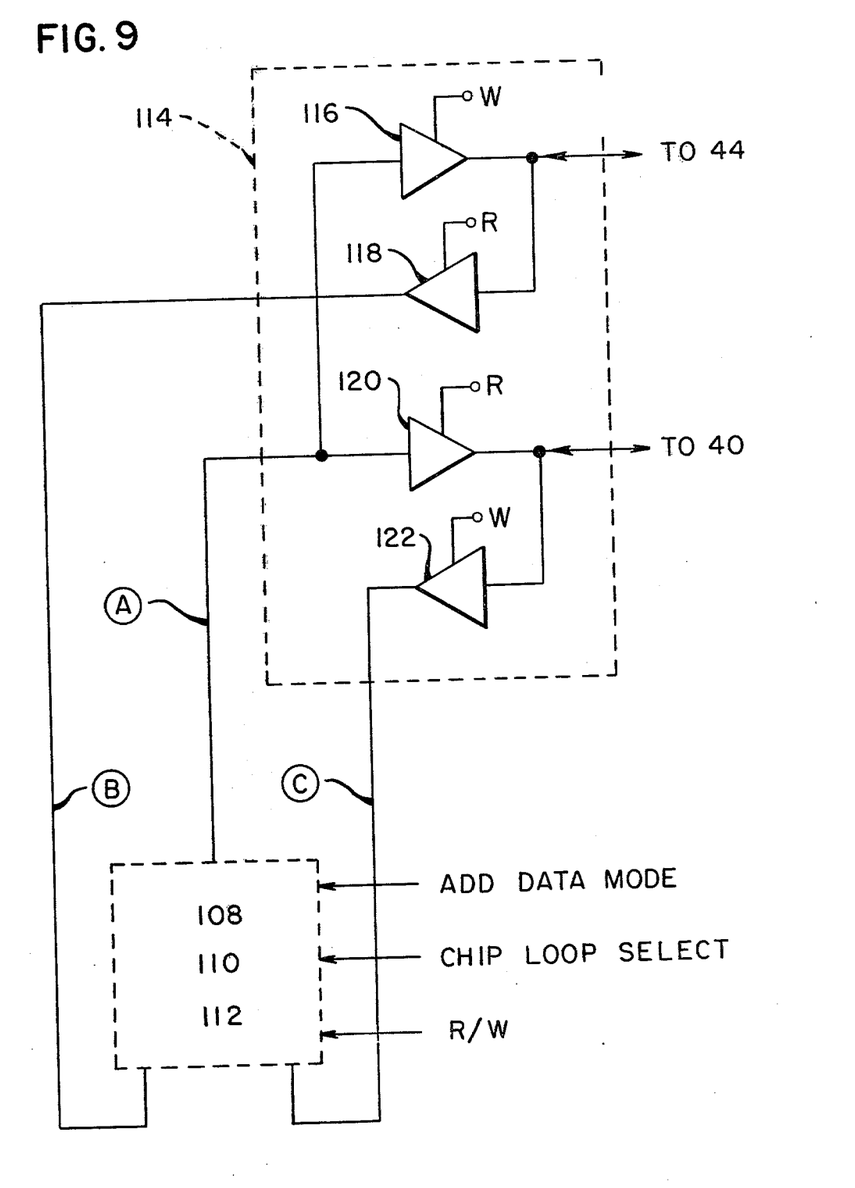
FIG. 9 is a schematic block diagram illustrating circuitry which may be utilized as part of the control logic of FIG. 8.

Referring now to FIG. 8, the system bus 40 receives an address message comprised of 38 bits labeled 0 to 37, with the first four bits being assigned the memory array board select address, the next four bits the row select address, and the succeeding six bits being assigned to the memory element chip loop select address with the next twelve bits being the loop starting address and the final twelve bits being the loop ending address. The first eight bits which comprise the board select and the row select address information, are directed to the address bus 32 and in turn to the board select decoder 28. The four board select bits are utilized to select one of the sixteen memory array boards. The row select bits are required to select one of the sixteen clock driver circuits $24_n$, via the 1 of 16 decoder 98. All of the memory elements 56 are synchronously clocked by the basic clock M. A position counter 100 keeps track (counts clock M) of the loop position of all of the memory elements. When a row of memory elements is selected, the position counter 100 contents are loaded into a select counter 104. The selected memory elements and the select counter 104 are then clocked at the fast clock rate N until the count in the select counter 104 equals the desired starting loop address as evidenced by a compare condition in the compare circuit 106, that is, a compare condition occurs when the loop starting address from system bus 40 matches the address contained in the select counter 104. Information is then either written into or read out from the memory elements until the select counter 104 address is equal to the loop ending address as compared in the comparator circuit 106. The selected memory element is clocked at the fast clock rate, N, until its address is coincident in location with the addresses of the unselected memory elements (that is, when the contents of the select counter 104 are equal to the contents of the position counter 100). A data register 110, having a length of 72 bits, is interposed between the output of a two-to-one multiplexer 112 and the input of a one-to-two multiplexer 108. The output of the data register 110 is directed to corresponding inputs of the multiplexer 108. The multiplexer 108 has outputs which in the WRITE mode are directed to the error correction code detector and corrector 48 and in the READ mode are directed to the system bus 40 for transmitting data to the bus. Circuitry for accomplishing this is shown in FIG. 9. Control of accepting the inputs from one or the other of the multiplexer 108 inputs is accomplished at the S terminal of multiplexer 108 with an ADD DATA MODE signal. The ADD DATA MODE signal is derived from computer system control signals which define the desired operating conditions of the memory portion of the computer system and the generation of which is well known in the prior art. The input to register 110 is from the output of a multiplexer 112. Multiplexer 112 has two muliplexed input terminal sets, one operatively connected to the error correction code detector and corrector 48 and the other operatively connected to the system bus 40. Selection of one or the other group of inputs is under control of a R/W input signal which is applied to the input terminal labeled S.

Referring to FIG. 9 in conjunction with FIG. 8, a switching circuit 114 is provided for each of the 72 bit positions handled by multiplexers 108 and 112. The inputs and outputs labeled A, B and C, in FIG. 9 correspond to like labeled inputs and outputs in FIG. 8. For the bit position "0" the $A_0$ output of multiplexer 108 is connected to the inputs of tri-gates 120 and 116. When the memory system is in the READ mode gate 120 is activated and the outputs of multiplexer 108 are directed to system bus 40. In the WRITE mode the outputs from multiplexer 108 are directed to the bus 44 and in turn to the error correction code detector and connector 48. The tri-gate 118 has its input connected to bus 44 and its output connected to the $B_0$ input of multiplexer 112. The tri-gate 122 has its input connected to the system bus 40 and its output connected to the $C_0$ input to multiplexer 112. From the foregoing it can be seen that the direction of signal flow for READ and WRITE operations is controllable by the switching circuit 114. The particular memory element loop address is directed into the system by the multiplexer 108 under the control of the ADD DATA MODE signal.

While there has been shown what is considered to be the preferred embodiment of the invention, it will be manifest that many changes and modifications may be made therein without departing from the essential spirit of the invention. It is intended, therefore, in the annexed claims, to cover all such changes and modifications as may fall within the true scope of the invention.

What is claimed is:

1. A READ/WRITE memory system comprising:
   a plurality of memory elements operatively connected in an addressable array;
   a plurality of enabling means each operatively associated with a corresponding memory element for detecting the state of a clock signal and for enabling an associated memory element when the clock signal is of a first state and for disabling said associated memory element when the clock signal is of a second state;
   means operatively connected to groups of said enabling means for applying a clock signal of a first state to said enabling means in response to an address selection signal and for applying to said enabling means a clock signal of a second state in the absence of an address selection signal;
   a plurality of operating mode means each associated with a corresponding memory element for receiving a mode signal and for responding to said mode signal when said associated memory elements are enabled by placing said memory element in a READ mode in response to a mode signal of a first state and in a WRITE mode in response to a mode signal of a second state; and
   means operatively connected to said operating mode means for controllably providing a mode signal of a first state to said plurality of memory elements to place enabled memory elements in a READ mode and for controllably providing a mode signal of a second state to place enabled memory elements in a WRITE mode.

2. A READ/WRITE memory system according to claim 1 wherein said means operatively connected to groups of said enabling means is comprised of:
   a multiplexer having first and second inputs and an output, said first input adapted to receive a first state clock signal and said second input adapted to receive a second state clock signal, said multiplexer responsive to said address selection signal to gate said first state clock signal to said enabling means and responsive to the absence of said address selection signal to gate said second state clock signal to said enabling means.

3. A READ/WRITE memory system comprising:
   a plurality of memory elements operatively connected in an addressable array;
   a plurality of said addressable arrays;
   decoder means for addressing selected ones of said addressable arrays;
   a plurality of enabling means each operatively associated with a corresponding memory element for detecting the state of a clock signal and for enabling an associated memory element when the clock signal is of a first state and for disabling said associated memory element when the clock signal is of a second state;
   clock means responsive to the addressing by said decoder means for applying a clock signal of a first state to said enabling means and for applying a clock signal of a second state in the absence of an addressing;
   a plurality of operating mode means each associated with a corresponding memory element for receiving a mode signal and for responding to said mode signal when said associated memory elements are enabled by placing said memory element in a READ mode in response to a mode signal of a first state and in a WRITE mode in response to a mode signal of a second state; and
   circuit means operatively connected to said operating mode means for controllably providing a mode signal of a first state to said plurality of memory elements to place enabled memory elements in a READ mode and for controllably providing a mode signal of a second state to place enabled memory elements in a WRITE mode.

4. The READ/WRITE memory system according to claim 3 wherein said decoder means is comprised of:
   a comparator having one set of inputs corresponding to the assigned address of an associated addressable array and a second input for receiving the address of a to be addressed array, said comparator providing an enabling output when the address on said first and said second input are identical; and a clock decoder having an enabling input operatively connected to receive the enabling output of said comparator, said clock decoder adpated to receive row select address signals and for enabling the clock means corresponding to the row select address.

5. The READ/WRITE memory system according to claim 3 and further comprising:

gating means interposed between said operating mode means and said circuit means for enabling said gating means in a first signal direction upon receipt of an address from said decoder means, and for enabling said gating means in a second direction in the absence of an address from said decoder means.

6. The READ/WRITE memory system according to claim 3 wherein said plurality of enabling means are pulse rate detectors for enabling a corresponding memory element when the clock signal is of a first rate and for disabling said memory element when the clock signal is of a second rate.

7. A READ/WRITE memory system comprising:

a plurality of memory elements operatively connected in groups to form addressable arrays;

a plurality of enabling means each operatively associated with a corresponding memory element for receiving a memory system synchronizing signal and for enabling an associated memory element upon detection of a change in the characteristics of said synchronizing signal;

decoder means responsive to a group address signal for providing a selection signal indicative of the particular group addressed;

synchronizing signal means responsive to said selection signal for providing a synchronizing signal to the group of said memory elements not selected and for providing a changed characteristic synchronizing signal to the group that is selected;

function driver and buffer circuit means operatively connected to groups of said memory elements for reading and writing data into a group of enabled memory elements in parallel; and a plurality of operating mode means each associated with a corresponding memory element for receiving a mode signal from said function driver and buffer circuit and for responding to said mode signal when said associated memory elements are enabled by placing said memory element in a READ mode in response to a mode signal of a first state and in a WRITE mode in response to a mode signal of a second state.

8. A READ/WRITE memory system according to claim 7 wherein said synchronizing signal means is comprised of a plurality of multiplexers corresponding in number to the groups of said memory elements, each multiplexer having first and second inputs, and an output, said first input adapted to receive a synchronizing signal and said second input adapted to receive a synchronizing signal of changed character, said multiplexers responsive to said selection signal to gate the signal on said second input to said output and in the absence of said selection signal to gate the signal on said first input to said output, the outpt of each multiplexer being operatively connected to a corresponding group of memory elements.

9. The READ/WRITE memory system according to claim 7 wherein said plurality of enabling means are pulse rate detectors for enabling a corresponding memory element when the synchronizing signal is of a first rate and for disabling said memory element when the synchronizing signal is of a second rate.

* * * * *